(12) United States Patent
Shang et al.

(10) Patent No.: US 8,860,407 B2
(45) Date of Patent: Oct. 14, 2014

(54) METHOD AND SYSTEM FOR PERFORMING ON-WAFER TESTING OF HEADS

(75) Inventors: Changhe Shang, Fremont, CA (US);
Daniele Mauri, San Jose, CA (US);
Kuok San Ho, Emerald Hills, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 204 days.

(21) Appl. No.: 13/436,732

(22) Filed: Mar. 30, 2012

(65) Prior Publication Data

US 2013/0257421 A1 Oct. 3, 2013

(51) Int. Cl.
*G01R 33/12* (2006.01)
*G11B 5/455* (2006.01)
*G11B 5/31* (2006.01)
*G01R 31/28* (2006.01)

(52) U.S. Cl.
CPC ............ *G01R 31/2875* (2013.01); *G11B 5/455* (2013.01); *G11B 5/3166* (2013.01)
USPC ........................................................ 324/210

(58) Field of Classification Search
CPC ............... G01B 5/455; G01R 31/2875; G01R 31/2877; G01R 33/09–33/098
USPC .................................................. 324/210, 212
See application file for complete search history.

(56) References Cited

U.S. PATENT DOCUMENTS

| | | | |
|---|---|---|---|
| 5,517,111 A | 5/1996 | Shelor | |
| 5,668,470 A | 9/1997 | Shelor | |
| 5,668,477 A | 9/1997 | Mahmoudian et al. | |
| 5,721,488 A | 2/1998 | Sakai et al. | |
| 5,926,019 A | 7/1999 | Okumura | |
| 6,479,988 B2 | 11/2002 | Hachisuka et al. | |
| 6,486,660 B1 | 11/2002 | Luse et al. | |
| 6,512,367 B2 | 1/2003 | Liu et al. | |
| 6,538,430 B2 | 3/2003 | Carrington et al. | |
| 6,828,784 B2 | 12/2004 | Yun et al. | |
| 6,943,545 B2 | 9/2005 | Patland et al. | |
| 7,323,870 B2 | 1/2008 | Tatschl et al. | |
| 7,417,423 B2 | 8/2008 | Sudou | |
| 7,550,967 B1 | 6/2009 | Patland et al. | |
| 7,863,911 B2 | 1/2011 | Hong et al. | |
| 7,872,471 B2 | 1/2011 | Yamanaka et al. | |
| 8,008,912 B1 | 8/2011 | Shang | |
| 2004/0075940 A1* | 4/2004 | Bajorek et al. | 360/110 |
| 2007/0188166 A1* | 8/2007 | Suk | 324/210 |
| 2007/0214634 A1* | 9/2007 | Yaguchi | 29/603.09 |
| 2008/0049351 A1 | 2/2008 | Yamanaka et al. | |
| 2008/0291579 A1* | 11/2008 | Uesugi et al. | 360/314 |
| 2009/0243602 A1 | 10/2009 | Yaguchi et al. | |
| 2010/0002327 A1* | 1/2010 | Call et al. | 360/31 |
| 2010/0157455 A1* | 6/2010 | Watanabe | 360/31 |
| 2012/0019945 A1* | 1/2012 | Chan et al. | 360/31 |

* cited by examiner

*Primary Examiner* — Patrick Assouad
*Assistant Examiner* — Demetrius Pretlow (57) ABSTRACT

A method and system for testing a read transducer are described. The read transducer includes a read sensor fabricated on a wafer. A system includes a test structure that resides on the wafer. The test structure includes a test device and a heater. The test device corresponds to the read sensor. The heater is in proximity to the test device and is configured to heat the test device substantially without heating the read sensor. Thus, the test structure allows for on-wafer testing of the test device at a plurality of temperatures above an ambient temperature.

19 Claims, 6 Drawing Sheets

METHOD AND SYSTEM FOR PERFORMING ON-WAFER TESTING OF HEADS

BACKGROUND

Figure 1:
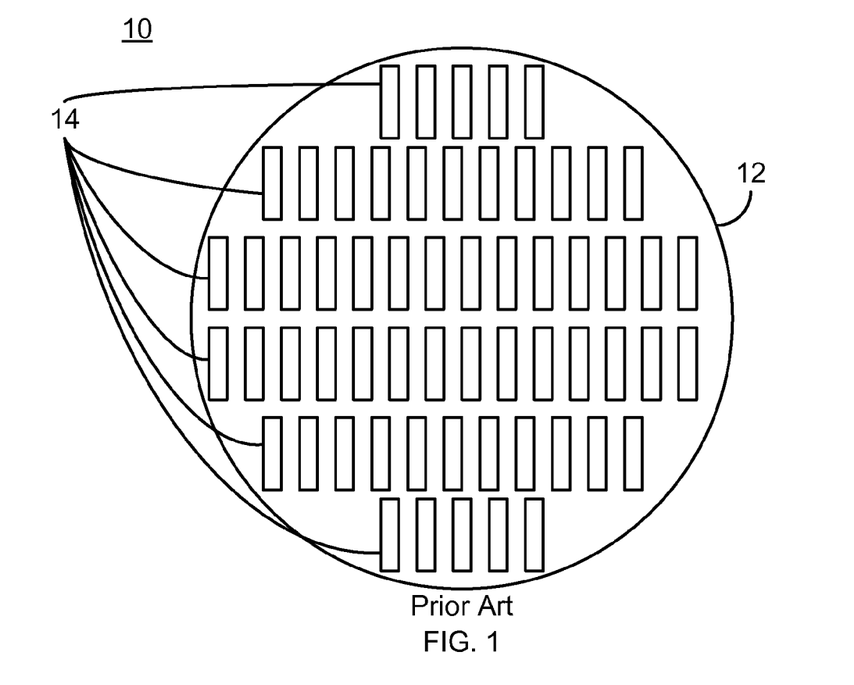
FIG. 1 is a diagram depicting a portion of a conventional array of heads.

FIG. 1 depicts a plan view of a conventional array 10 of magnetic recording heads formed on a wafer, or substrate, 12. The conventional array 10 includes heads 14 that are formed in rows. Although only six rows of five, eleven, or fourteen heads are shown, typically a larger number of rows and a larger numbers of heads 14 per row are fabricated. The heads 14 include write transducer and read transducers. The write transducers may be perpendicular magnetic recording (PMR), energy assisted magnetic recording (EAMR), or other writers. The read transducers typically include tunneling magnetoresistive (TMR) or other analogous read sensors.

Figure 2:
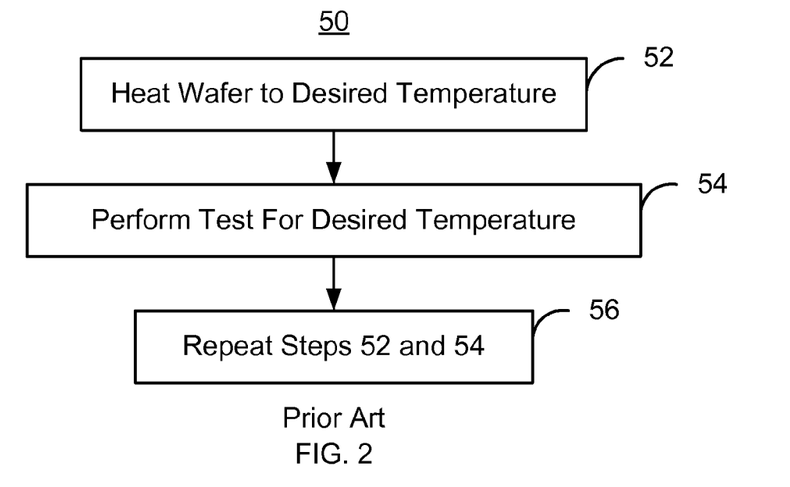
FIG. 2 is a flow chart depicting a conventional method for testing an array of heads.

FIG. 2 depicts a conventional method 50 for testing the heads 14. For simplicity, only a portion of the method 50 is described. The wafer 12 is heated to a desired temperature, via step 52. Step 52 may include placing the entire wafer 12 in a furnace. The furnace may then be set to the desired temperature, and time allowed for the temperature of the wafer 12 to equilibrate. Alternatively, if cooler temperatures are desired for testing, step 52 could include cooling the wafer 12 to the desired temperature. Test(s) may be performed on the heads 14 using the desired temperature, via step 54. For example, the magnetoresistance or other properties at particular temperatures might be determined. Steps 52 and 54 may then be repeated for a variety of temperatures.

Although the heads 14 may be fabricated in a conventional array 10 and tested using the method 50, there are significant drawbacks. Many of the tests desired to be performed for the heads 14 are destructive. At least some of these tests are desired to be performed on-wafer. An on-wafer test is one which is performed with most or all of the devices 14 remaining on the wafer 12 during the test. Once these destructive tests are performed in on-wafer testing, the heads 14 can no longer be placed in devices to be used and/or sold. For example, the blocking temperature (Tb) and distribution in the blocking temperatures (TbD) of the TMR sensors in the heads 14 may be desired to be known. These can be determined using the method 50. To do so, the wafer is heated in step 52. In step 54, a magnetic field is applied while the wafer 12 is at the elevated temperature, the wafer is then cooled to room temperature, and the transfer curve of the TMR sensor is determined for the magnetic field applied at that elevated temperature. More specifically, the resistance versus field is determined at room temperature for each read sensor in each head 14. Once the temperature to which the wafer 12 is heated in step 52 exceeds the blocking temperature of the TMR sensor, the shape of the transfer curve changes. Thus, the blocking temperature can be determined for the heads 14. However, because the heads 14 have been heated above the blocking temperature, the read sensors in the heads 14 may be damage. As a result, the heads 14 are no longer usable. Thus, the heads 14 for which the most information is known can no longer be placed in devices. Further, if there are variations between wafers, the method 50 may not adequately capture these variations or allow prediction of the characteristics of heads on other wafers. Even if separate test structures (not shown in FIG. 1) are placed on the wafer 12, the method 50 is still used to test the heads 14. Thus, the same issues relating to damage of the heads 14 are still faced.

Accordingly, what is needed are improved methods and systems for testing arrays of heads.

BRIEF SUMMARY OF THE INVENTION

A method and system for testing a read transducer are described. The read transducer includes a read sensor fabricated on a wafer. A system includes a test structure that resides on the wafer. The test structure includes a test device and a heater. The test device corresponds to the read sensor. The heater is in proximity to the test device and is configured to heat the test device substantially without heating the read sensor. Thus, the test structure allows for on-wafer testing of the test device at a plurality of temperatures above an ambient temperature.

DETAILED DESCRIPTION OF THE EMBODIMENTS OF THE INVENTION

Figure 3:
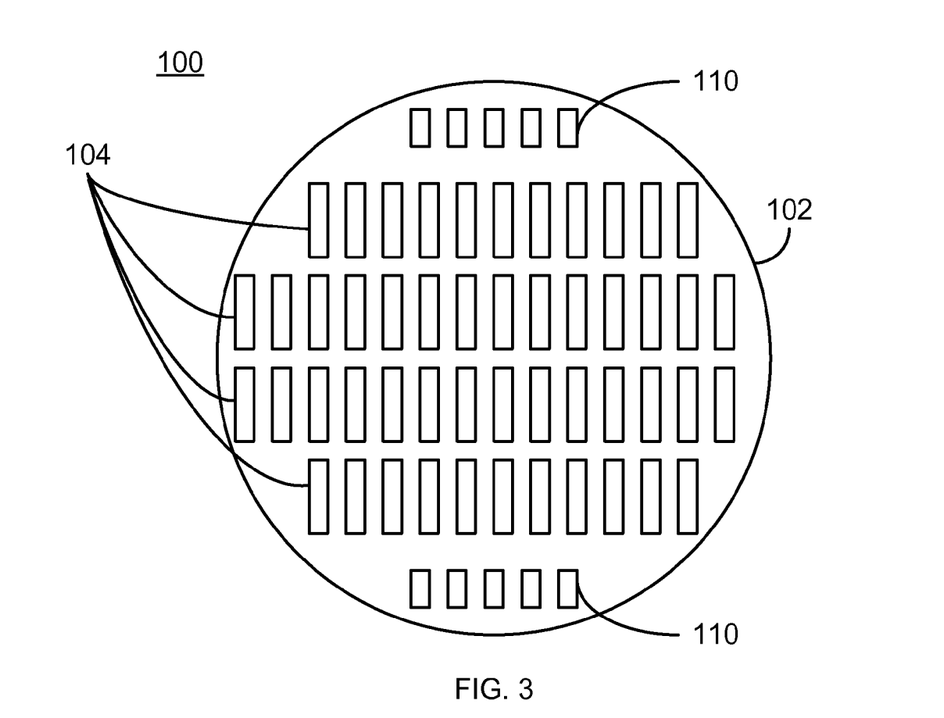
FIG. 3 is a diagram depicting an exemplary embodiment of an array of heads.

FIG. 3 is a diagram depicting an exemplary embodiment of an array 100 of heads formed on a substrate, or wafer 102. For clarity, FIG. 3 is not to scale. The array 100 includes heads 104 and test structures 110. For clarity, only some heads 104 and test devices 110 are labeled. Only four rows each having a particular number of heads 104 are shown for simplicity. However, in general, the wafer 102 has a larger number of rows and a larger number of heads 104 per row. For example, in some embodiments, the wafer 102 includes multiple flash fields, each of which includes 51 rows (or bars) of heads 104. Each of the heads 104 includes at least one read transducer. In other embodiments, each of the heads 104 may include at least one write transducer and at least one read transducer. The write transducers may be perpendicular magnetic recording (PMR), energy assisted magnetic recording (EAMR), or other writers. The read transducers typically include one or more tunneling magnetoresistive (TMR) or other analogous read sensors.

The array 100 also includes test structures 110. Only two rows each having five test structures 110 are shown for simplicity. However, in general, the wafer 102 has a larger number of rows and a larger number of test structures 110 per row. The test structures 110 are formed distal from the heads 104. In another embodiment, any test structure 110 is at least one hundred microns or more from any head 104. In still another embodiment, any test structure 110 is at least three hundred microns or more from any head 104. However, other distances from the heads 104 are possible. For example, the distance between the test structure 110 and the heads 104 is desired to be such that temperatures to which the test structure 110 is exposed are dissipated substantially before reaching any of the heads 104. In some embodiments the heads 104 remain substantially at an ambient (e.g. room) temperature while the test structure(s) 110 are at higher temperatures. In other embodiments, the temperature of the heads 104 may increase above ambient the temperature when the temperature of the test structure(s) 110 are increased. However, the heads 104 are not raised to temperatures which would adversely affect the performance of the components of the heads 104. For example, the TMR or other read sensors in the read transducer of the heads 104 would remain functional during and after test(s) which raise the test structures 110 to desired temperatures above ambient temperature. Thus, the In the embodiment shown, the test structures 110 on the same wafer 102 as the heads 104 can be subjected to higher temperature for on-wafer testing without adversely affecting performance of the heads 104 that also remain on the wafer. In the array 100 shown, the test structures 110 are in rows separate from the heads 104. However, in other embodiments, the test structures 110 may be interspersed with the heads 104. In such embodiments, the spacing between the test structures 110 and heads 104 is still such that the test structures 110 may be heated without adversely affecting performance of the heads 104.

Figure 4:
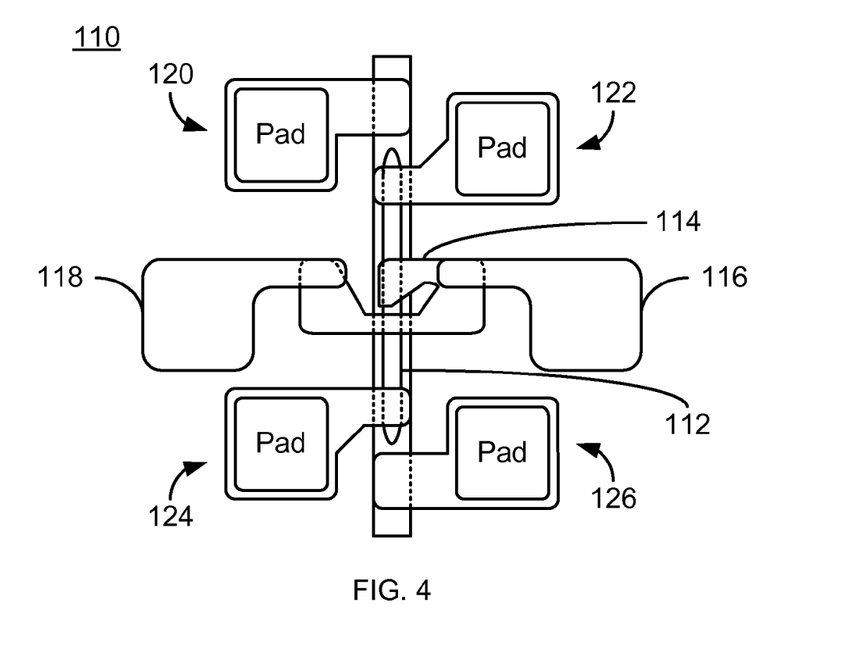
FIG. 4 is a diagram depicting an exemplary embodiment of a portion of a test structure in an array.
Figure 5:
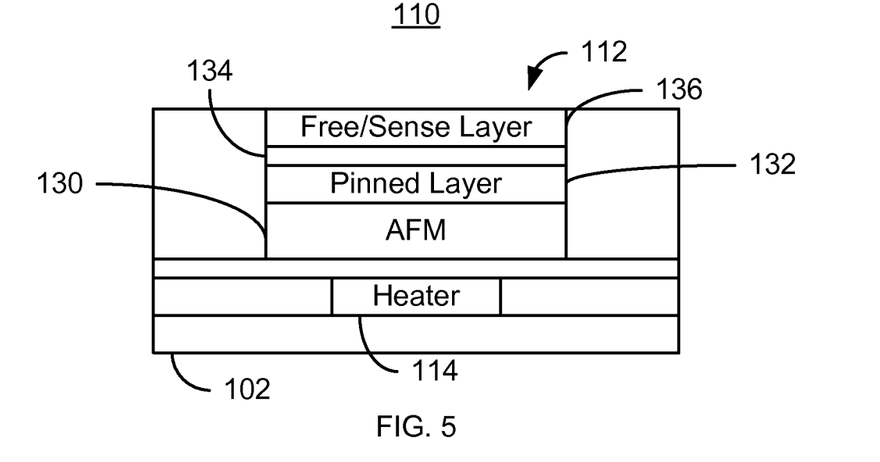
FIG. 5 is a diagram depicting an exemplary embodiment of a test device in a test structure.

FIGS. 4 and 5 depict top and side views of a portion of a test structure 110 that may be used in the array 100. For clarity, FIGS. 4 and 5 are not to scale. Further, for simplicity, not all components are labeled in FIGS. 4 and 5. The dashed lines in FIG. 4 depict regions in which components of the test structure 110 overlap. The test structure 110 includes at least one test device 112 and at least one heater 114. For clarity, only one test device 112 and only one heater 114 are depicted. In other embodiments, other number(s) of test devices 112 and heaters 114 may be used. Also shown are connections 116, 118, 120, 122, 124, and 126. The connections 116 and 118 are used to drive the heater 114. Thus, a current may be driven through the heater 114 and between the connections 116 and 118. Connections 120, 122, 124, and 126 are used to perform measurement(s) on the test device 112. For example, a four-point resistance measurement may be performed on the test device 112. In other embodiments, a different number of connections 116, 118, 120, 122, 124, and 126 may be used. Further, in other embodiments, additional components may be provided in the test structure 110.

The test device 112 corresponds to desired component(s) in the head 104. In the embodiment shown in FIGS. 4 and 5, the test device 112 corresponds to a read sensor in the heads 104. Thus, as is shown in FIG. 5, the test device 112 may be a magnetoresistive sensor including an antiferromagnetic (AFM) layer 130, a pinned layer 132, a nonmagnetic layer 134 such as a tunneling barrier or metallic spacer layer, and a free layer 136. However, in other embodiments, the test device 112 may include other and/or different components.

The heater 114 may be a resistive or other heater. In some embodiments, the heater 114 is substantially the same as dynamic fly height heaters (not shown) that resides in the heads 104. The performance of the heater 114 is also desired to be predictable. For example, in some embodiments, the heater 114 may be calibrated such that a particular power driven through the heater 114 corresponds to particular temperatures of the test device 112. In such embodiments, a separate temperature measurement of the test device 112 may be omitted during testing. However, in other embodiments, a temperature sensor (not shown) may be included in the test structure 110. In such embodiments, the heater 114 may not need to be calibrated as precisely, if at all.

As can be seen in FIGS. 4-5, the heater 114 is in proximity to the test device 112. In the embodiment shown in FIG. 5, the heater 114 is between the substrate 102 and the test device 112. In other embodiments, the test device 112 may be between the heater 114 and the substrate 102. Alternatively, the heater 114 may be located in the substantially the same layer as the test device 112. The heater 114 is also shown as being centered on the test device 112. However, in other embodiments, the center of the heater 114 and the center of the test device 112 may be offset. Regardless of the location of the heater 114 and test device 112 with respect to the substrate/wafer 102, the heater 114 is in proximity to the test device 112. As a result, the heater 114 may locally heat the test device 112. In some embodiments, the entirety of the test structure 112 may be heated. More specifically, the heater 114 may heat the region of the test device 112 to a desired temperature for testing without heating the heads 104 to temperatures that will adversely affect performance of the heads. The presence of the heater 114 in the test structure 110 thus allows the test structure 110 to be used for on-wafer testing of the test device 112 at a plurality of temperatures above an ambient temperature.

Using the test structure 110, the test device 112 may be tested at elevated temperatures substantially without adversely affecting performance of the heads 104. Thus, the test device 112 may be heated to relatively high temperature without adversely affecting performance of the heads 104. For example, the blocking temperatures and distribution in blocking temperatures of the test devices 112 may be desired to be determined. The blocking temperature corresponds to an interaction between the AFM 130 and pinned layer 132. To determine the blocking temperature, the test device 112 is heated to temperature(s) above ambient (room temperature) by driving various power levels through the heater 114. These elevated temperatures include temperatures that are greater than or equal to the blocking temperature of the test device 112. As a result, the test device 112 may be damaged during testing. Because the heater 114 is in proximity to the test device 112, the temperature of the test device 112 can be raised relatively easily. However, the heads 104 are far from the heaters 114. In some embodiments, any head 104 is at least one hundred microns from the heater 114. In other embodiments, any test structure 110 is at least three hundred microns or more from any head 104. In contrast, the heater 114 is typically not more than ten microns from the test device 112. In some embodiments, the heater 114 is less than 5 microns from the test device 112. In addition, heating may be localized to within a few tens of microns of the heater 114. Thus, despite heating the test device 112, heat from the heater 114 may be dissipated in a region away from the heads 104. The temperatures of the heads 104 remain below the blocking temperature. In some embodiments, the heads 104 remain at or near room temperature.

Thus, using the test structures 110, on-wafer testing may be achieved. For example, stability and reliability testing may be performed on-wafer. This on-wafer testing may include destructive testing of the test devices 112. The destructive testing does not, however, adversely affect performance of the heads 104 that will actually be used in manufactured devices. As a result, wafers 102 having good heads 104 may be more readily separated from those having defective heads 104. Consequently, cost and time savings may be achieved.

Figure 6:
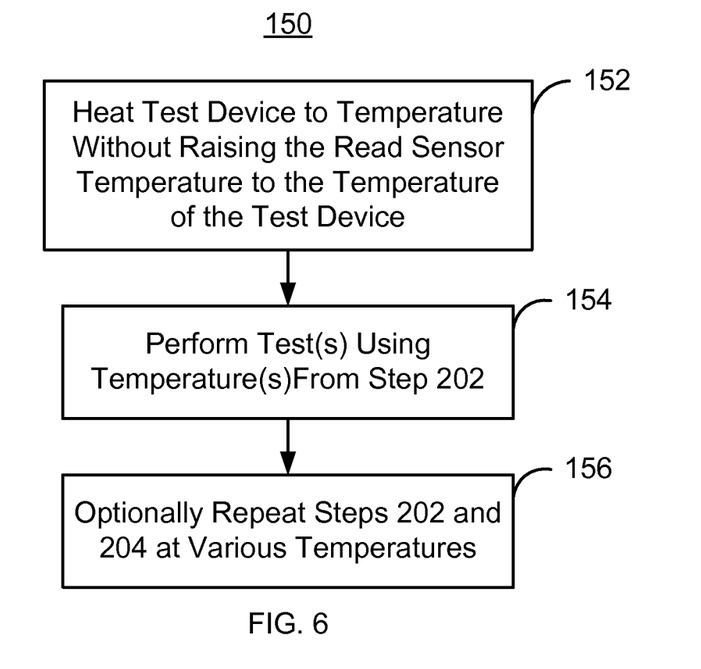
FIG. 6 is a flow chart depicting an exemplary embodiment of a method for non-destructively testing an array heads.

For example, FIG. 6 is a flow chart depicting an exemplary embodiment of a method 150 for non-destructively testing an array heads. Although certain steps are shown, some steps may be omitted, interleaved, performed in another order, and/or combined. The method 150 is described in the context of the array 100, substrate 102, heads 104, test structures 110, test devices 112, and heaters 114 depicted in FIGS. 3-5. However, other arrays, substrates, heads, test structures, test devices, and/or heaters may be used.

The test device(s) 112 of test structure(s) are heated to a desired temperature, via step 152. Step 152 is accomplished without raising the temperature of the heads 104 on the same wafer 102 to the same temperature as the test device(s) 112. For example, the temperature of the read sensor (not explicitly shown) remains below the temperature of the test device 112. In some embodiments, the temperature of the head 104, and thus its read sensor(s), remains substantially at room temperature during step 152. In other embodiments, the temperature of the head 104 may be raised somewhat, but performance of the head 104 is not adversely affected. In order to achieve this result, step 152 may include heating the test device 112 with the heater 114.

Test(s) are performed on the test device(s) 112 at the temperature, via step 154. In some embodiments, step 154 includes collecting data at the elevated temperature. In other embodiments, a portion of the test is performed at the temperature, but data are collected at other temperatures. For example, for a blocking temperature determination, magnetic fields may be applied at elevated temperatures, but magnetoresistance data collected at room temperature.

Steps 152 and 154 may be optionally repeated for various temperatures, via step 156. Consequently, the test structure 110 may be test at a variety of temperatures. Step 156 may allow for a better determination of the temperature dependence of the properties of the test structures 110, and thus the heads 104, to be determined.

Using the method 150, properties of the array 100 may be determined using the test structures 110 without adversely affecting performance of the heads 104. For example, the blocking temperature of each of the test devices 112 may be determined. Thus, the test devices 112 may be heated to temperatures at or above the blocking temperature without heating the heads 104 to such high temperatures. In some embodiments, the heads 104 remain at room temperature when the test device(s) are at or above their blocking temperature. Thus, destructive on-wafer testing of properties of the test structures 110 may be achieved without adversely affecting performance of the heads 104. Further, it has been found using the method 150 that the test devices 112, and thus the sensors in the heads 104, have geometry dependent blocking temperatures. In particular, the heads 104 and test devices 112 are small. In some embodiments, the AFM 130 may only include a few grains. As a result, the blocking temperatures may vary with the size of the test devices 112. Because they are fabricated in the same manner and on the same wafer, the blocking temperatures of the read sensors in the heads 104 should have a similar geometry. This geometry/size dependence may be determined without damaging the heads 104 using the method 150. The method 150 may also be extended to test the geometry dependence of other structures, such a pinned layer that extends further from the air-bearing surface (ABS) than other layers in the test device 110.

Thus, using the test structures 110, on-wafer testing may be achieved. For example, stability and reliability testing may be performed on-wafer. This on-wafer testing may include destructive testing of the test devices 112. The destructive testing does not, however, adversely affect performance of the heads 104 that will actually be used in manufactured devices. As a result, wafers 102 having good heads 104 may be more readily separated from those having defective heads 104. Further, such determinations might be made earlier in time. Consequently, cost and time savings may be achieved. Moreover, the geometry dependence of properties of the heads 104 may be determined. Thus, design of future heads may be aided.

Figure 7:
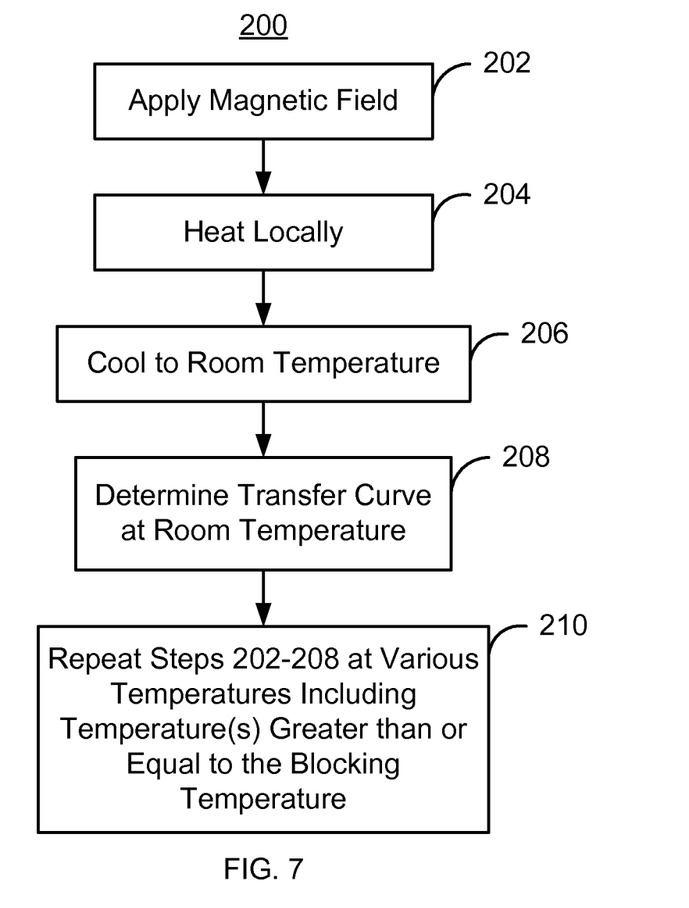
FIG. 7 is a flow chart depicting another exemplary embodiment of a method for non-destructively testing an array heads.
Figure 8:
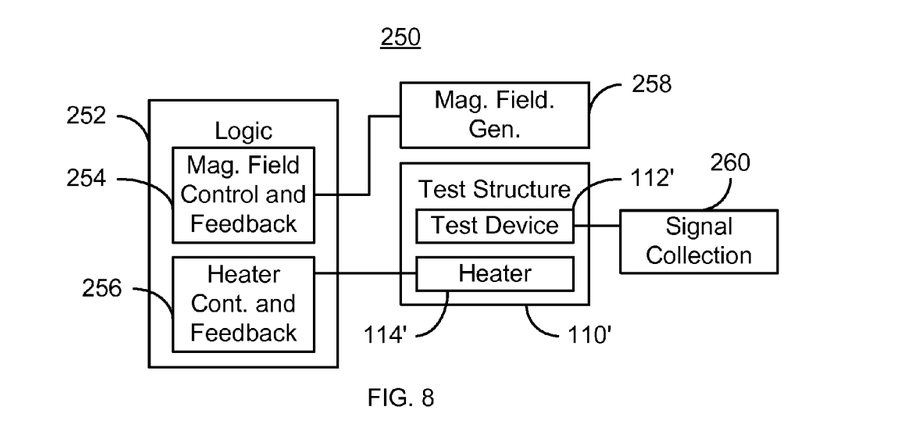
FIG. 8 is a diagram depicting an exemplary embodiment of a system for non-destructive testing of an array of heads.

FIG. 7 is a flow chart depicting another exemplary embodiment of a method 200 for non-destructively testing an array heads. More specifically, the method 200 may be used to determine blocking temperatures of the test devices. Although certain steps are shown, some steps may be omitted, interleaved, performed in another order, and/or combined. FIG. 8 depicts a block diagram of a system 250 for performing on-wafer testing of heads. For clarity, some components of the system 250 are not shown. The system 250 includes logic 252 for controlling some components of the system 200, a magnetic field generator 258, and signal collection block 260 as well as the test structure 110'. The logic 252 includes a magnetic field control and feedback block 254 as well as heater control and feedback 256. Although only one test structure 110' is shown, multiple test structures may be used. The test structure 110' is analogous to the test structure 110 and remains on a wafer 102. The method 200 is described in the context of the array 100, substrate 102, heads 104, test structures 110, test devices 112, and heaters 114 depicted in FIGS. 3-5. However, other arrays, substrates, heads, test structures, test devices, heaters, and/or test systems may be used. Further, the method 200 is described in the context of a single test device 112/112'. However, multiple test devices 112/112' may be tested in parallel.

A magnetic field is applied to a test device 112 and allowed to reach a steady state field, via step 202. Step 202 includes using magnetic field control and feedback block 254 to control the magnetic field generator 258. In particular, the desired current may be driven through an electromagnet in the magnetic field generator 258 to obtain the desired field at the test devices 112/112'. Feedback may be used to ensure that the magnetic field does not significantly overshoot the desired field and/or to maintain the desired magnetic field for a desired time. Note that in at least some embodiments, other test devices 112 and/or the heads 104 on the wafer are subjected to substantially the same magnetic field because a magnetic field is generally not a localized phenomenon.

The test device is heated to a desired temperature, via step 204. Step 204 includes energizing the heater 114/114' using heater control and feedback block 256. Step 204 also takes place after the magnetic field has equilibrated in step 202. The logic circuitry 252 may be configured such that the magnetic field reaches a desired test magnetic field before the power is driven through the heater 114/114'. Feedback may be used to ensure that the heater 114/114' does not significantly overshoot the desired temperature and/or to maintain the desired temperature for a particular time. In some embodiments, a particular power is driven through the heater in step 204. Generally, the power is roughly proportional to the temperature. In addition, the test device temperature vs. heater power for the heater 114/114' may have been calibrated previously or may be calibrated after the method 200 has terminated. Step 204 is accomplished without raising the temperature of the heads 104 on the same wafer 102 to the same temperature as the test device(s) 112/112'. Thus the heating of the test device 112/112' is localized. In some embodiments, the heating is localized to within a few tens of microns. For example, the temperature of the read sensor (not explicitly shown) remains below the temperature of the test device 112. In some embodiments, the temperature of the head 104, and thus its read sensor(s), remains substantially at room temperature during step 204. In other embodiments, the temperature of the head 104 may be raised somewhat, but performance of the head 104 is not adversely affected.

The test device 112/112' is cooled to room temperature, via step 206. Step 206 may simply include using the heater control and feedback 256 to shut down power to the heater 114/114' and allowing the test structure 110/110' to cool.

Figure 9:
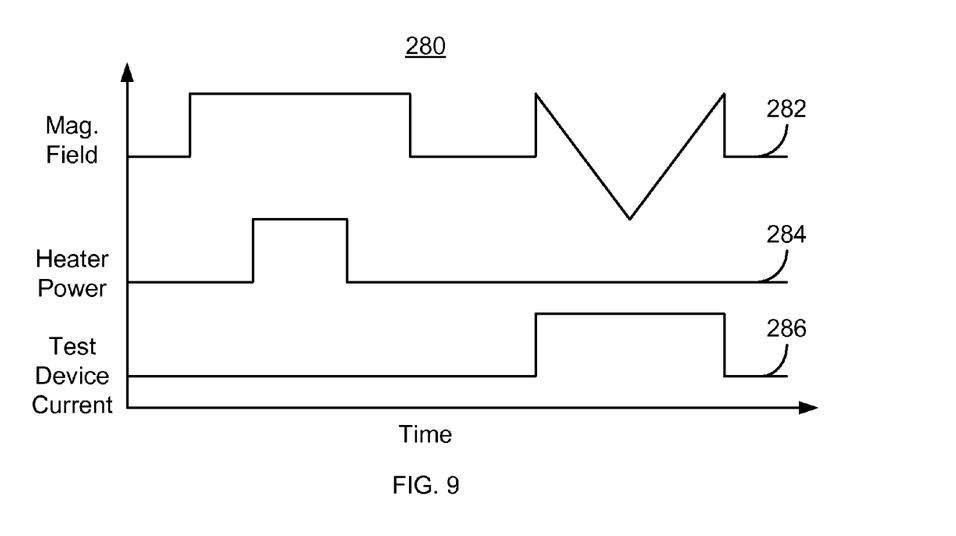
FIG. 9 is a graph depicting an exemplary embodiment of signals provided for non-destructive testing of an array of heads.

A transfer curve is determined for the test device 112/112' at room temperature, via step 208. Step 208 includes determining the magnetoresistance of the test device 112/112' versus field. For example, FIG. 9 is a graph depicting an exemplary embodiment of signals provided for non-destructive testing of an array 100 of heads using the method 200. As can be seen in signal 282 of FIG. 9, the magnetic field is energized first in steps 202 and allowed to reach its equilibrium value. A certain time later (for example, two seconds) the heater 114/114' is energized in step 204 using signal 284. Power is provided to the heater for a certain time. Thus, the test device 112/112' is subjected to a high field and elevated temperature for a certain amount of time. As can be seen in signal 284, the power to the heater 114/114' is then terminated and the test device 112/112' is allowed to cool in step 206. After the heater power is off, the magnetic field is turned off, as can be seen in signal 282. Thus, the test device 112/112' is exposed to the same magnetic field throughout heating and cooling. Finally, in step 208, the magnetic field is swept as seen in signal 282 while the test device 112/112' is energized in signal 286. Thus, steps 202-208 may be performed with a particular timing.

Steps 202-208 may be repeated at various temperatures, via step 210. In some embodiments, temperature is monotonically increased each time steps 202-208 are repeated. Thus, a better determination of the blocking temperature may be made. As part of step 210, the transfer curves may be compared after each iteration of the steps 202-208. Once the transfer curve changes due to disordering of the test device 112/112', the method 200 may be terminated.

Thus, using the method 200, the blocking temperature of the test devices 112/112' may be determined in on-wafer testing. As part of this test, the test devices 112/112' are damaged because they are subjected to temperatures at or above the blocking temperature. This destructive testing does not, however, adversely affect performance of the heads 104 that will actually be used in manufactured devices because heat from the heater 114/114' is dissipated away from the heads 104. As a result, wafers 102 having good heads 104 may be more readily separated from those having defective heads 104. This separation may also take place earlier in time. Consequently, cost and time savings may be achieved. Moreover, the geometry dependence of properties of the heads 104 may be determined. Thus, design of future heads may be aided.

Figure 10:
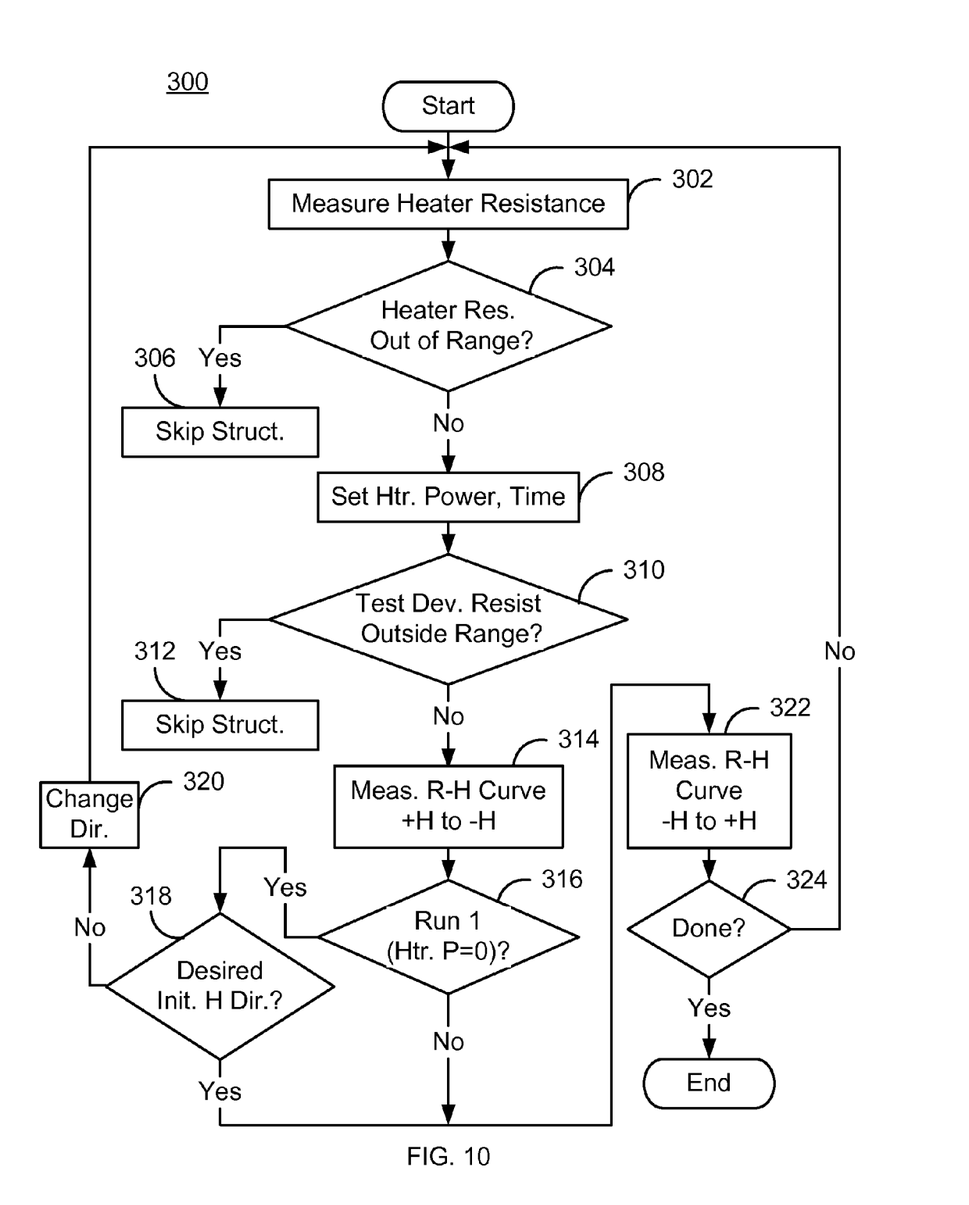
FIG. 10 is a flow chart depicting another exemplary embodiment of a method for non-destructively testing an array heads.

FIG. 10 is a flow chart depicting another exemplary embodiment of a method 300 for non-destructively testing an array heads. The method 300 may be used to determine blocking temperatures of the test devices. Although certain steps are shown, some steps may be omitted, interleaved, performed in another order, and/or combined. The method 300 is described in the context of the array 100, substrate 102, heads 104, test structures 110/110', test devices 112/112', heaters 114/114, and system 250 depicted in FIGS. 3-5 and 8. However, other arrays, substrates, heads, test structures, test devices, heaters, and/or test systems may be used. Further, the method 300 is described in the context of a single test device 112/112'. However, multiple test devices 112/112' may be tested in parallel.

The resistance of the heater 114/114' is measured, via step 302. It is then determined whether the resistance of the heater 114/114' is not within the desired range, via step 304. In some embodiments, step 304 determines whether the heater resistance greater than some desired threshold value. Step 304 essentially determines whether the heater 114/114' is expected to work as desired. In the embodiment shown, the threshold value it the maximum desired resistance of the heater 114/114'. For example, it may be determined whether the resistance of the heater is greater than one thousand Ohms. If the heater resistance is outside of the desired working range, then the test structure 110/110' is skipped, via step 306.

If the heater resistance is not outside of the desired range, then the desired heater power and time for heating are set in step 308. In the first iteration of step 308, the power for the heater 114/114' is set to zero to obtain a room temperature measurement. In other iterations, the power may be greater than for a previous iteration, but less than for a next iteration (if any). However, for all iterations, most or all of the power generated is dissipated away from the heads 104. It is determined whether the resistance of the test device 112/112' is outside the desired range, via step 310. In other words, it the resistance of the test device 112/112' is measured and a determination made as to whether this resistance exceeds an upper limit or is less than a lower limit. Step 310 thus determines whether the test device 112/112' is operable. If the resistance of the test device 112/112' is outside the desired range, then the test structure 110/110' is skipped, via step 312. If the resistance of the test device 112/112' is not outside of the range, then the test device 112/112' should operate as desired. Consequently, the resistance versus field of the test device 112/112' is determined from a negative maximum desired field to a positive maximum desired field, step 314. Thus, data for half of the transfer curve is collected in step 314.

It is then determined whether the measurement just taken was for a first iteration of the method 300, via step 316. If so, then it is determined whether the external magnetic field applied in step 314 is in the desired direction with respect to the magnetization of the pinned layer 132, via step 318. If not, then the direction of the external field is reset for the remainder of the method, via step 320. The method 300 will then restart with the external magnetic field in the desired direction.

If this is not the first run, then the remainder of the transfer curve is measured—from a positive maximum field to a negative maximum field, via step 322. It is then determined whether the test is completed, via step 324. For example, in step 324 it may be determined whether the test device resistance is outside of a given range, whether the heater resistance is above a threshold, or whether the maximum power through the heater has been reached. If the method is not done, then the method 300 is repeated, but for a different heater power.

Using the method 300, the blocking temperature of the test devices 112/112' may be determined in on-wafer testing. As part of this test, the test devices 112/112' are damaged because they are subjected to temperatures at or above the blocking temperature. This destructive testing does not, however, adversely affect performance of the heads 104 that will actually be used in manufactured devices because heat from the heater 114/114' is dissipated away from the heads 104. As a result, wafers 102 having good heads 104 may be more readily separated from those having defective heads 104. This separation may also take place earlier in time. Consequently, cost and time savings may be achieved. Moreover, the geometry dependence of properties of the heads 104 may be determined. Thus, design of future heads may be aided.

We claim:

1. A system for testing a read transducer including a read sensor fabricated on a wafer, the system comprising:

a test structure fabricated on and integrated with the wafer, the test structure including a test device and a heater, the test device corresponding to the read sensor, the heater in proximity to the test device and heating the test device without heating the read sensor, the test structure allowing for on-wafer testing of the test device at a plurality of temperatures above an ambient temperature.

2. The system of claim 1 wherein the heater resides between the test device and the wafer.

3. The system of claim 1 wherein the test device resides between the heater and the wafer.

4. The system of claim 1 wherein the plurality of temperatures further includes a temperature not less than a blocking temperature of the test device.

5. The system of claim 4 wherein the test structure is configured such that the read sensor is at a read sensor temperature of less than the blocking temperature when the test device is at the blocking temperature.

6. The system of claim 5 wherein the read sensor temperature is room temperature when the test device is at the blocking temperature.

7. The system of claim 1 further comprising:
logic circuitry for controlling a power driven through the heater.

8. The system of claim 7 wherein the logic circuitry further controls a magnetic field for the at least one test structure.

9. The system of claim 8 wherein the logic circuitry is configured such that the magnetic field reaches a desired test magnetic field before the power is driven through the heater.

10. The system of claim 1 wherein the test structure is at least one hundred microns away from each of the read transducer.

11. A method for testing a read transducer including a read sensor fabricated on a wafer, the method comprising:
heating a test device of a test structure to a temperature without raising a read sensor temperature of the read sensor to the temperature using a heater, the test structure being fabricated on and integrated with the wafer, the test structure including the test device and the heater, the test device corresponding to the read sensor, the temperature being greater than the read sensor temperature; and
performing at least one test on the test device at the temperature, the at least one test for determining at least one of a blocking temperature and a magnetoresistance of the test device.

12. The method of claim 11 wherein the read sensor temperature is room temperature when the test device is at the temperature.

13. The method of claim 11 wherein the temperature to which the test device is heated is not less than a blocking temperature of the test device.

14. The method of claim 13 wherein the read sensor temperature is room temperature when the temperature of the test device is at least the blocking temperature.

15. The method of claim 11 wherein the step of performing the at least one test further includes:
applying a magnetic field to the test device, the magnetic field reaching a steady state before the step of heating the test device starts.

16. The method of claim 11 further comprising:
repeating the steps of heating the test device and performing the at least one test are repeated for a plurality of temperatures.

17. The method of claim 11 wherein the step of heating the test device includes:
driving the heater, the heater residing in proximity to the test device and distal from the read sensor.

18. A method for testing a read transducer including a read sensor fabricated on a wafer, the method comprising:
applying a magnetic field at a steady state field to a test device of a test structure, the test structure being fabricated on and integrated with the wafer and including the test device corresponding to the read sensor and a heater;
heating the test device using the heater, the test device being to a temperature without raising a read sensor temperature of the read sensor to the temperature, the temperature being greater than the read sensor temperature;
allowing the the test device to cool to room temperature;
determining a transfer curve for the test device, the step of determining the transfer curve further including measuring a magnetoresistance of the test device at a plurality of magnetic fields; and
repeating the steps of applying the magnetic field, heating the test device, cooling the test device, and determining the transfer curve a plurality of times at a plurality of temperatures including a high temperature at least a blocking temperature of the test device such that a blocking temperature of the test device is determined without adversely affecting performance of the read sensor.

19. The method of claim 18 wherein a geometry dependence of the blocking temperature is determined.

* * * * *